(12) United States Patent
Kamakura et al.

(10) Patent No.: US 11,728,162 B2
(45) Date of Patent: Aug. 15, 2023

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Tsukasa Kamakura, Toyama (JP); Kiyohisa Ishibashi, Toyama (JP); Ryota Kataoka, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 220 days.

(21) Appl. No.: 17/144,195

(22) Filed: Jan. 8, 2021

(65) Prior Publication Data

US 2021/0217608 A1    Jul. 15, 2021

(30) Foreign Application Priority Data

Jan. 9, 2020   (JP) ................. 2020-002063

(51) Int. Cl.
*H01L 21/02* (2006.01)
*C23C 16/34* (2006.01)
(Continued)

(52) U.S. Cl.
CPC ........ *H01L 21/0223* (2013.01); *C23C 16/345* (2013.01); *C23C 16/45529* (2013.01); *C23C 16/56* (2013.01); *H01L 21/0217* (2013.01); *H01L 21/0228* (2013.01); *H01L 21/02164* (2013.01); *H01L 21/02211* (2013.01)

(58) Field of Classification Search
None
See application file for complete search history.

(56) References Cited

U.S. PATENT DOCUMENTS

| 8,895,455 B2 | 11/2014 | Akae et al. |
| 2009/0170345 A1 | 7/2009 | Akae et al. |

(Continued)

FOREIGN PATENT DOCUMENTS

| JP | 61-077330 A | 4/1986 |
| JP | 05-251637 A | 9/1993 |

(Continued)

OTHER PUBLICATIONS

Singapore Search Report dated Nov. 11, 2021 for Singapore Patent Application No. 10202100223T.

(Continued)

*Primary Examiner* — Asok K Sarkar
(74) *Attorney, Agent, or Firm* — Volpe Koenig

(57) ABSTRACT

There is provided a technique that includes: forming an oxide film having a predetermined thickness on a surface of a substrate by performing a cycle a plurality of times, the cycle including non-simultaneously performing: (a) forming a nitride film by supplying a film-forming gas to the substrate; and (b) oxidizing and changing the nitride film into a first oxide film by supplying an oxidizing gas to the substrate, wherein a maximum distance from an interface between the nitride film formed in (a) and a base of the nitride film to a surface of the nitride film is set to 2 nm or more and 4 nm or less.

25 Claims, 5 Drawing Sheets

(51) Int. Cl.
    *C23C 16/455*     (2006.01)
    *C23C 16/56*     (2006.01)

(56)           References Cited

U.S. PATENT DOCUMENTS

| | | |
|---|---|---|
| 2011/0028002 A1 | 2/2011 | Hirota |
| 2011/0076857 A1 | 3/2011 | Akae et al. |
| 2012/0045903 A1 | 2/2012 | Harada et al. |
| 2017/0092489 A1 | 3/2017 | Ishizaka et al. |
| 2017/0162386 A1 | 6/2017 | Hashimoto et al. |
| 2017/0263439 A1 | 9/2017 | Hashimoto et al. |
| 2021/0118667 A1* | 4/2021 | Fukazawa ......... C23C 16/45542 |

FOREIGN PATENT DOCUMENTS

| | | |
|---|---|---|
| JP | 2007-294949 A | 11/2007 |
| JP | 2010-050425 A | 3/2010 |
| JP | 2010-087167 A | 4/2010 |

OTHER PUBLICATIONS

Singapore Written Opinion dated Nov. 11, 2021 for Singapore Patent Application No. 10202100223T.
Korean Office Action dated Mar. 18, 2022 for Korean Patent Application No. 10-2021-0002497.
Japanese Office Action dated Jan. 26, 2022 for Japanese Patent Application No. 2020-002063.
Taiwan Office Action dated Aug. 31, 2022 for Taiwan Patent Application No. 110100343.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-002063, filed on Jan. 9, 2020 the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of forming an oxide film including formation of a nitride film on a substrate and conversion of the nitride film into the oxide film by oxidizing the nitride film may be carried out.

SUMMARY

Some embodiments of the present disclosure provide a technique that improves a quality of an oxide film formed on a substrate.

According to an embodiment of the present disclosure, there is provided a technique that includes: forming an oxide film having a predetermined thickness on a surface of a substrate by performing a cycle a plurality of times, the cycle including non-simultaneously performing: (a) forming a nitride film by supplying a film-forming gas to the substrate; and (b) oxidizing and changing the nitride film into a first oxide film by supplying an oxidizing gas to the substrate, wherein a maximum distance from an interface between the nitride film formed in (a) and a base of the nitride film to a surface of the nitride film is set to 2 nm or more and 4 nm or less.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Embodiments of the present disclosure will now be described mainly with reference to FIGS. 1 to 4D.

(1) Configuration of the Substrate Processing Apparatus

Figure 1:
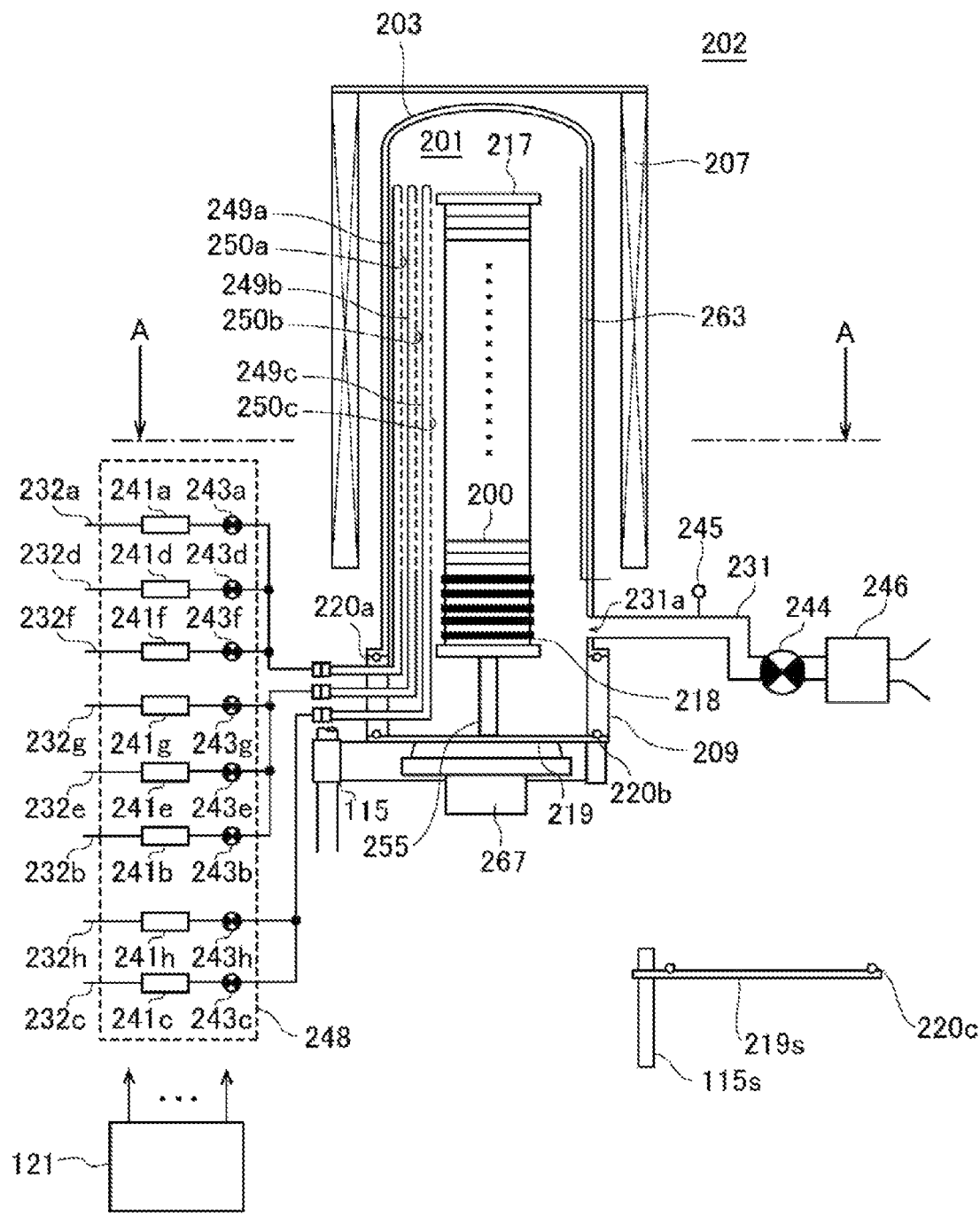
FIG. 1 is a schematic configuration diagram of a vertical type process furnace of a substrate processing apparatus suitably used in embodiments of the present disclosure, in which a portion of the process furnace 202 is shown in a vertical cross-sectional view.

As illustrated in FIG. 1, a process furnace 202 includes a heater 207 as a temperature adjustor (heating part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will be referred to as first to third nozzles, respectively. The nozzles 249a to 249c are each made of a heat resistant material such as quartz, SiC or the like. Gas supply pipes 232a to 232c are connected to the nozzles 249a to 249c respectively. The nozzles 249a to 249c are different nozzles, in which each of the nozzles 249a to 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c sequentially from the corresponding upstream sides of gas flow, respectively. Gas supply pipes 232d and 232f are respectively connected to the gas supply pipe 232a at the downstream side of the valve 243a. Gas supply pipes 232e and 232g are respectively connected to the gas supply pipe 232b at the downstream side of the valve 243b. A gas supply pipe 232h is connected to the gas supply pipe 232c at the downstream side of the valve 243c. MFCs 241d to 241h and valves 243d to 243h are installed at the gas supply pipes 232d to 232h sequentially from the corresponding upstream sides of gas flow, respectively. The gas supply pipes 232a to 232h are each made of a metal material such as stainless steel (SUS) or the like.

Figure 2:
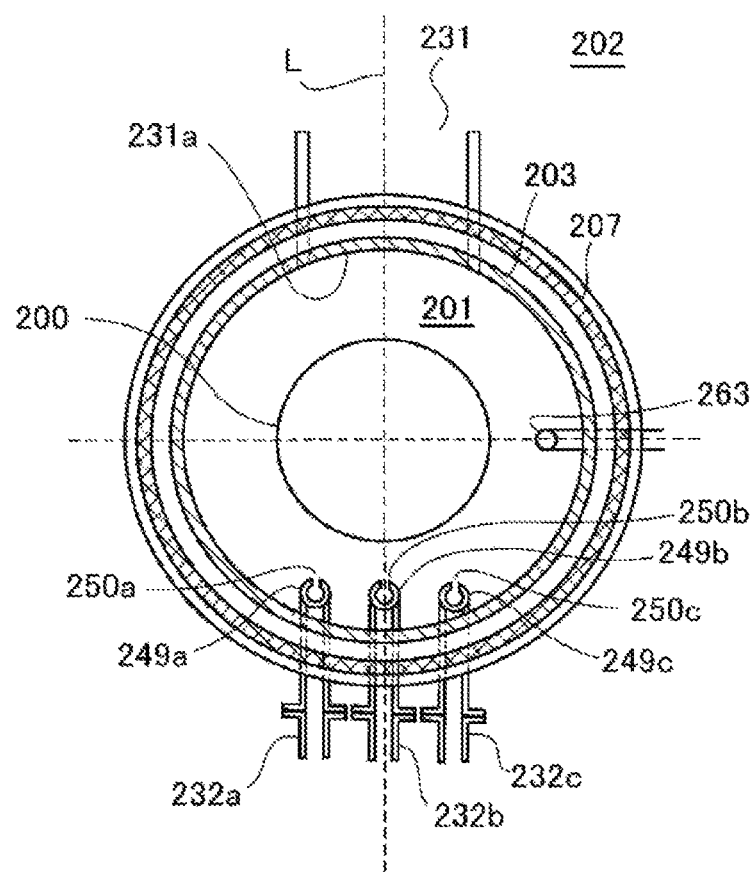
FIG. 2 is a schematic configuration diagram of the vertical type process furnace of the substrate processing apparatus suitably used in embodiments of the present disclosure, in which a portion of the process furnace 202 is shown in a cross-sectional view taken along a line A-A in FIG. 1.

As illustrated in FIG. 2, the nozzles 249a to 249c are disposed in a space with an annular plane-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a, which is described below, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed at the side surfaces of the nozzles 249a to 249c, respectively. The gas supply holes 250a to 250c are opened to face the exhaust port 231a in the plane view, thus allowing a gas to be supplied toward the wafers 200. The gas supply holes 250a to 250c may be formed in a plural number between the lower portion and the upper portion of the reaction tube 203.

A precursor (precursor gas), for example, a silane-based gas which contains silicon (Si) as a main element constituting a film to be formed on each of the wafers 200, is supplied from the gas supply pipe 232a into the process chamber 201 via the MFC 241a, the valve 243a, and the nozzle 249a. As the silane-based gas, it may be possible to use, for example, a gas containing Si and halogen, i.e., a halosilane-based gas. The halogen includes chlorine (CO, fluorine (F), bromine (Br), iodine (I), and the like. As the halosilane-based gas, it may be possible to use, for example, a chlorosilane-based gas containing Si and Cl. As the chlorosilane-based gas, it may be possible to use, for example, a hexachlorodisilane ($Si_2Cl_6$, abbreviation: HCDS) gas. The HCDS gas is a gas containing two Si in one molecule, and is also a gas which is more easily decomposed (more easily adsorbed or more reactive) than a $SiCl_4$ gas to be described below, under the same condition. The precursor gas having such characteristics will be referred to as a second precursor gas for the sake of convenience.

A nitriding gas (nitriding agent), for example, a nitrogen (N)-containing gas, is supplied from the gas supply pipe 232b into the process chamber 201 via the MFC 241b, the valve 243b, and the nozzle 249b. As the N-containing gas, it may be possible to use, for example, a hydrogen nitride-based gas containing N and hydrogen (H). As the hydrogen nitride-based gas, it may be possible to use, for example, an ammonia ($NH_3$) gas.

An oxidizing gas (oxidizing agent), for example, an oxygen (O)-containing gas, is supplied from the gas supply pipe 232c into the process chamber 201 via the MFC 241c, the valve 243c, and the nozzle 249c. As the O-containing gas, it may be possible to use, for example, an oxygen ($O_2$) gas.

A precursor (precursor gas), for example, a silane-based gas which contains Si as a main element constituting a film to be formed on each of the wafers 200, is supplied from the gas supply pipe 232d into the process chamber 201 via the MFC 241d, the valve 243d, the gas supply pipe 232a, and the nozzle 249a. As the silane-based gas, it may be possible to use, for example, a gas containing Si and halogen, i.e., a halosilane-based gas. As the halosilane-based gas, it may be possible to use, for example, a chlorosilane-based gas containing Si and Cl. As the chlorosilane-based gas, it may be possible to use, for example, a tetrachlorosilane ($SiCl_4$, abbreviation: STC) gas. The STC gas is a gas containing one Si in one molecule, and is also a gas which is more difficult to decompose (more difficult to adsorb or less reactive) than the aforementioned HCDS gas under the same condition. The precursor gas having such characteristics will be referred to as a first precursor gas for the sake of convenience.

For example, a H-containing gas is supplied from the gas supply pipe 232e into the process chamber 201 via the MFC 241e, the valve 243e, the gas supply pipe 232b, and the nozzle 249b. The H-containing gas alone does not obtain an oxidation action, but it reacts with an O-containing gas under a specific condition to generate oxidation species such as atomic oxygen (O) or the like and acts to improve an efficiency of oxidizing reaction. As the H-containing gas, it may be possible to use, for example, a hydrogen ($H_2$) gas.

An inert gas, for example, a nitrogen ($N_2$) gas, is supplied from the gas supply pipes 232f to 232h into the process chamber 201 via the MFCs 241f to 241h, the valves 243f to 243h, the gas supply pipes 232a to 232c, and the nozzles 249a to 249c. The $N_2$ gas acts as a purge gas, a carrier gas, a dilution gas, or the like.

A precursor gas supply system (second precursor gas supply system) mainly includes the gas supply pipe 232a, the MFC 241a, and the valve 243a. A N-containing gas supply system mainly includes the gas supply pipe 232b, the MFC 241b, and the valve 243b. An O-containing gas supply system mainly includes the gas supply pipe 232c, the MFC 241c, and the valve 243c. A precursor gas supply system (first precursor gas supply system) mainly includes the gas supply pipe 232d, the MFC 241d, and the valve 243d. A H-containing gas supply system mainly includes the gas supply pipe 232e, the MFC 241e, and the valve 243e. An inert gas supply system mainly includes the gas supply pipes 232f to 232h, the MFCs 241f to 241h, and the valves 243f to 243h.

Further, each or all of the precursor gases (the first precursor gas and the second precursor gas) and the N-containing gas will be referred to as a film-forming gas, and each or all of the precursor gas supply systems (the first precursor gas supply system and the second precursor gas supply system) and the N-containing gas supply system will be referred to as a film-forming gas supply system. In addition, each or both of the O-containing gas and the H-containing gas will be referred to as an oxidizing gas, and each or both of the O-containing gas supply system and the H-containing gas supply system will be referred to as an oxidizing gas supply system.

One or all of various supply systems described above may be configured as an integrated supply system 248 in which the valves 243a to 243h, the MFCs 241a to 241h, and the like are integrated. The integrated supply system 248 is connected to each of the gas supply pipes 232a to 232h so that a supply operation of various kinds of gases into the gas supply pipes 232a to 232h, i.e., an opening/closing operation of the valves 243a to 243h, a flow rate adjusting operation by the MFCs 241a to 241h or the like, is controlled by a controller 121 to be described below. The integrated supply system 248 is configured as an integral type or division type integrated unit, and may be attached to or detached from the gas supply pipes 232a to 232h or the like on an integrated unit basis, such that maintenance, replacement, expansion or the like of the integrated supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down. A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel or the like, and is formed in a disc shape. An O-ring 220c as a seal member making contact with the lower end portion of the manifold 209 is installed on an upper surface of the shutter 219s. An opening/closing operation (an elevation movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
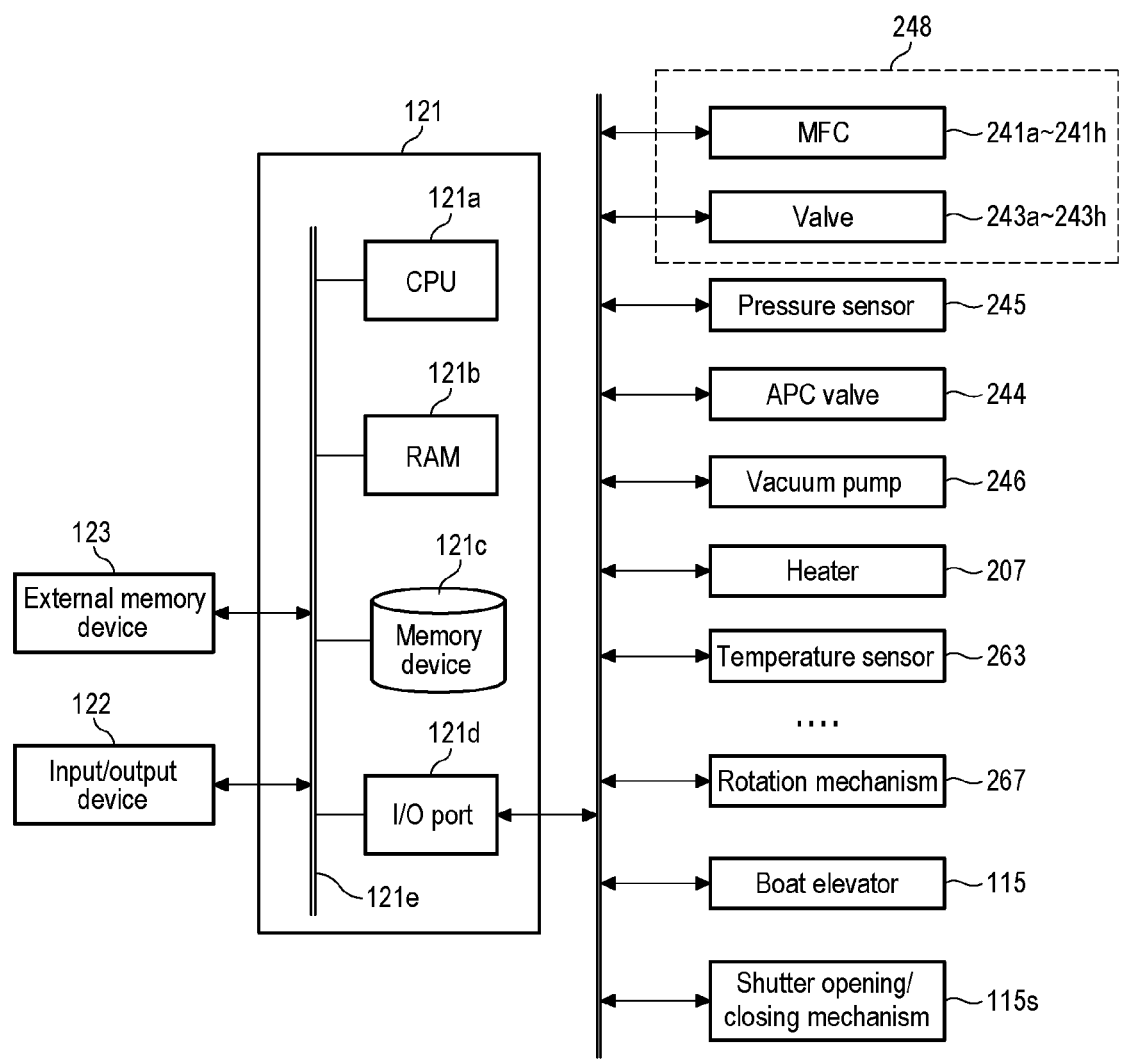
FIG. 3 is a schematic configuration diagram of a controller 121 of a substrate processing apparatus suitably used in embodiments of the present disclosure, in which a control system of the controller 121 is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. An input/output device 122 configured as, for example, a touch panel or the like, is connected to the controller 121.

The memory device 121c includes, for example, a flash memory, a hard disk drive (HDD), or the like. A control program that controls operations of a substrate processing apparatus, a process recipe in which sequences, conditions and the like of substrate processing to be described below are described, and the like are readably stored in the memory device 121c. The process recipe functions as a program configured to be capable of causing the controller 121 to execute each sequence in the substrate processing to be described later to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 and adjusting the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as a HDD, an optical disc such as a CD, a magneto-optical disc such as a MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer by using a communication means such as the Internet or a dedicated line, instead of using the external memory device 123.

(2) Substrate Processing

A processing sequence example of forming an oxide film having a predetermined thickness on a wafer 200 as a substrate by using the aforementioned substrate processing apparatus, which is a process for manufacturing a semiconductor device, will be described mainly with reference to FIGS. 4A to 4D, and 5. In the following descriptions, the operations of the respective parts constituting the substrate processing apparatus are controlled by the controller 121.

In the processing sequence according to the present embodiment, a SiO film having a predetermined thickness is formed on a surface of a wafer 200 by performing a cycle a plurality of times ($n_2$ times, where $n_2$ is an integer of 2 or more), the cycle including non-simultaneously performing a step of forming a silicon nitride film (SiN film) as a nitride film by supplying a HCDS gas as a precursor gas and a $NH_3$ gas as a nitriding gas, as film-forming gases, to the wafer 200 (nitride film formation), and a step of oxidizing and changing the SiN film into a silicon oxide film (SiO film) as an oxide film by supplying an $O_2$ gas and a $H_2$ gas as an oxidizing gas to the wafer 200 (oxide film formation).

Further, in the processing sequence according to the present embodiment, a set including a step of supplying a HCDS gas to the wafer 200 and a step of supplying a $NH_3$ gas to the wafer 200 is performed a predetermined number of times ($n_1$ times, where $n_1$ is an integer of 1 or more) in the nitride film formation.

In addition, in the processing sequence according to the present embodiment, an $O_2$ gas and a $H_2$ gas are simultaneously supplied to the wafer 200 in the oxide film formation.

Further, in the processing sequence according to the present embodiment, a maximum distance X from an interface between the SiN film formed in the nitride film formation and a base of the SiN film to a surface of the SiN film is set to 2 nm or more and 4 nm or less.

Figure 5:
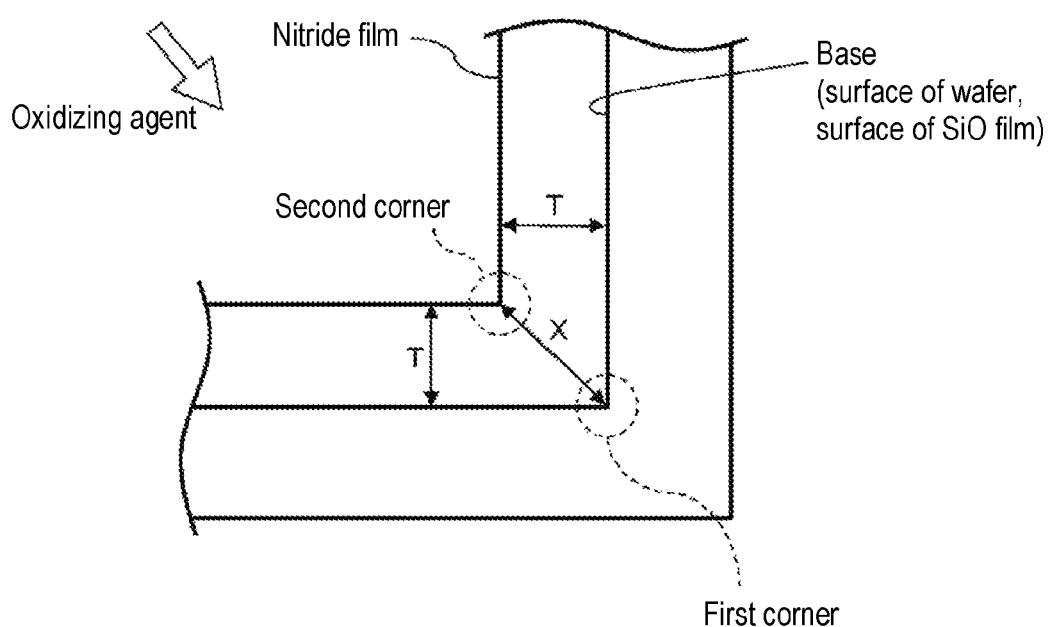
FIG. 5 is a partial enlarged cross-sectional of a surface of a laminated structure including a base including a first corner and a silicon nitride film including a second corner caused to be formed by the first corner.

In the present disclosure, the maximum distance X described above is not limited to a size equivalent to a thickness T of the SiN film formed on the flat base but may be larger than this thickness T. This is because uneven structures such as trenches or pillars may be formed in advance on the surface of the wafer 200, which is the base of the SiN film, to form a non-flat portion (first corner) thereon, as illustrated in FIG. 5. In this case, the SiN film formed on the base has a non-flat portion (second corner) caused to be formed by the first corner. When the base has the first corner, the aforementioned maximum distance X has a size equivalent to the distance from the first corner to the second corner (indicated by X in FIG. 5). That is, the aforementioned maximum distance X when the SiN film is formed on the base including the corner may be larger than the thickness of the SiN film formed on the flat base including no corner (indicated by T in FIG. 5), which is, for example, about 1.4 times the thickness T.

In the present disclosure, for the sake of convenience, the processing sequence described above may sometimes be denoted as follows. The same denotation will be used in the modifications and the like as described below.

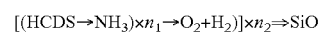

[(HCDS→$NH_3$)×$n_1$→$O_2$+$H_2$)]×$n_2$⇒SiO

When the term "wafer" is used herein, it may refer to a wafer itself or a laminated body of a wafer and a layer or film formed on the surface of the wafer. In addition, when the phrase "a surface of a wafer" is used herein, it may refer to a surface of a wafer itself or a surface of a layer or the like formed on a wafer. Further, in the present disclosure, the expression "a layer is formed on a wafer" may mean that a layer is directly formed on a surface of a wafer itself or that a layer is formed on a layer or the like formed on a wafer. In addition, when the term "substrate" is used herein, it may be synonymous with the term "wafer."

(Wafer Charging and Boat Loading)

When a plurality of wafers 200 is charged on the boat 217 (wafer charging), the shutter 219s may be moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, which is a space where the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Further, the wafers 200 in the process chamber 201 are heated by the heater 207 to have a desired processing temperature. In this operation, the degree of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 begins. The exhaust of the interior of the process chamber 201 and the heating and rotation of the wafers 200 may be all continuously performed at least until the processing of the wafers 200 is completed.

(Nitride Film Formation)

Next, the following steps 1 and 2 are sequentially performed.

[Step 1]

At step 1, a HCDS gas is supplied to the wafer 200 in the process chamber 201.

Specifically, the valve 243a is opened to allow the HCDS gas to flow through the gas supply pipe 232a. A flow rate of the HCDS gas is adjusted by the MFC 241a. The HCDS gas is supplied into the process chamber 201 via the nozzle 249a and is exhausted from the exhaust port 231a. At this time, the HCDS gas is supplied to the wafer 200 (HCDS gas supply). Simultaneously, the valves 243f to 243h may be opened to supply a $N_2$ gas into the process chamber 201 via the nozzles 249a to 249c.

Processing conditions at this step may be exemplified as follows:

HCDS gas supply flow rate: 0.01 to 2 slm, specifically 0.1 to 1 slm in some embodiments $N_2$ gas supply flow rate (per gas supply pipe): 0 to 10 slm Supply time of each gas: 1 to 120 seconds, specifically 1 to 60 seconds in some embodiments Processing temperature: 400 to 800 degrees C., specifically 600 to 700 degrees C. in some embodiments Processing pressure: 1 to 2,666 Pa, specifically 67 to 1,333 Pa in some embodiments.

Further, in the present disclosure, an expression of a numerical range such as "1 to 2,666 Pa" may mean that a lower limit value and an upper limit value are included in that range. Therefore, for example, "1 to 2,666 Pa" may mean "1 Pa or more and 2,666 Pa or less". The same applies to other numerical ranges.

By supplying the HCDS gas to the wafer 200 under the aforementioned condition, a Si-containing layer containing Cl is formed on the outermost surface of the wafer 200 as a base. The Si-containing layer containing Cl is formed by physisorption or chemisorption of HCDS on the outermost surface of the wafer 200, chemisorption of a substance in which a portion of HCDS is decomposed (hereinafter, $Si_xCl_y$), deposition of Si by pyrolysis of HCDS, or the like. The Si-containing layer containing Cl may be an adsorption layer of HCDS or $Si_xCl_y$ (a physisorption layer or a chemisorption layer), or may be a deposition layer of Si containing Cl. In the present disclosure, the Si-containing layer containing Cl will be simply referred to as a Si-containing layer.

After the Si-containing layer is formed, the valve 243a is closed to stop the supply of the HCDS gas into the process chamber 201. Then, the interior of the process chamber 201 is vacuum-exhausted and the gas or the like remaining within the process chamber 201 is removed from the interior of the process chamber 201 (purge). At this time, the valves 243f to 243h are opened to supply a $N_2$ gas into the process chamber 201. The $N_2$ gas acts as a purge gas.

As the precursor gas, it may be possible to use, in addition to the HCDS gas, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a STC gas, and an octachlorotrisilane ($Si_3Cl_8$, abbreviation: OCTS) gas, a fluorosilane-based gas such as a tetrafluorosilane ($SiF_4$) gas, a bromosilane-based gas such as a tetrabromosilane ($SiBr_4$) gas, or an iodosilane-based gas such as a tetraiodosilane ($SiI_4$) gas.

As the inert gas, it may be possible to use, in addition to the $N_2$ gas, a rare gas such as an Ar gas, a He gas, a Ne gas, and a Xe gas. The same applies to each step to be described below.

[Step 2]

After step 1 is completed, a $NH_3$ gas is supplied to the wafer 200 in the process chamber 201, namely the Si-containing layer formed on the wafer 200.

Specifically, the valve 243b is opened to allow the $NH_3$ gas to flow through the gas supply pipe 232b. A flow rate of the $NH_3$ gas is adjusted by the MFC 241b. The $NH_3$ gas is supplied into the process chamber 201 via the nozzle 249b and is exhausted from the exhaust port 231a. At this time, the $NH_3$ gas is supplied to the wafer 200 ($NH_3$ gas supply). Simultaneously, the valves 243f to 243h may be opened to supply the $N_2$ gas into the process chamber 201 via the nozzles 249a to 249c.

Processing conditions at this step may be exemplified as follows:

$NH_3$ gas supply flow rate: 0.1 to 10 slm

Supply time of $NH_3$ gas: 1 to 120 seconds, specifically 1 to 60 seconds in some embodiments Processing pressure: 1 to 4,000 Pa, specifically 1 to 3,000 Pa in some embodiments.

Other processing conditions may be similar to the processing conditions of step 1.

By supplying the $NH_3$ gas to the wafer 200 under the aforementioned condition, at least a portion of the Si-containing layer formed on the wafer 200 is nitrided (modified). As a result, a silicon nitride layer (SiN layer) is formed as a layer containing Si and N on the outermost surface of the wafer 200 as a base. When forming the SiN layer, an impurity such as Cl contained in the Si-containing layer forms a gaseous substance containing at least Cl in the process of modifying the Si-containing layer with the $NH_3$ gas and is discharged from the interior of the process chamber 201. Thus, the SiN layer becomes a layer containing a smaller amount of the impurity such as Cl than that of the Si-containing layer formed at step 1.

After the SiN layer is formed, the valve 243b is closed to stop the supply of the $NH_3$ gas into the process chamber 201. Then, the gas or the like, which remains within the process chamber 201, is removed from the interior of the process chamber 201 according to the same processing procedures as those of the purge at step 1 (purge).

As the nitriding gas, it may be possible to use, in addition to the $NH_3$ gas, for example, a hydrogen nitride-based gas such as a diazene ($N_2H_2$) gas, a hydrazine ($N_2H_4$) gas, and a $N_3H_8$ gas.

[Performing a Set a Predetermined Number of Times]

Figure 4A:
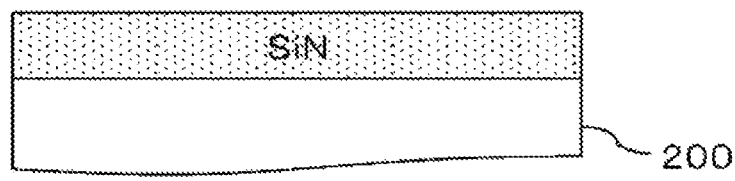
FIG. 4A is a partial enlarged cross-sectional view of a surface of a wafer 200 after a silicon nitride film is formed on the surface of the wafer 200 as a base.

A set which non-simultaneously, that is, non-synchronously, performs steps 1 and 2 described above is implemented a predetermined number of times ($n_1$ times, where $n_1$ is an integer of 1 or more), whereby a SiN film having a predetermined thickness to be described below can be formed on the surface of the wafer 200 as a base, as illustrated in FIG. 4A. The aforementioned cycle may be performed multiple times. That is, the thickness of the SiN layer formed per one cycle may be set smaller than a desired thickness, and the aforementioned cycle may be performed multiple times until the thickness of the SiN film formed by laminating the SiN layer becomes equal to the desired thickness.

Further, in the nitride film formation, the number of times of performing the set $n_1$ (the number of sets) is set such that the aforementioned maximum distance X has a predetermined size which falls within a range of 2 nm or more and 4 nm or less.

When the aforementioned maximum distance X is less than 2 nm, the number of times of performing a cycle (the number of cycles) $n_2$ to be described below, which non-simultaneously performs the nitride film formation and the oxide film formation, may increase, lowering a productivity of substrate processing. By setting the aforementioned maximum distance X to a size of 2 nm or more, it is possible to appropriately reduce the number of cycles $n_2$ to be described below, which non-simultaneously performs the nitride film formation and the oxide film formation, and to improve the productivity of the substrate processing.

Further, if the aforementioned maximum distance X exceeds 4 nm, when the SiN film is changed into a SiO film in the oxide film formation to be described below, N may remain in the changed film. In particular, when the surface of the wafer 200 includes a first corner, N is likely to remain near the first corner in the SiN film. By setting the aforementioned maximum distance X to a size of 4 nm or less, it is possible to suppress N from remaining in the changed film when changing the SiN film into the SiO film in the oxide film formation to be described below.

By setting the aforementioned number of sets $n_1$ to fall within a range of, for example, 10 to 30 times, it is possible to set the maximum distance X to a predetermined size which falls within the aforementioned range in the nitride film formation.

(Oxide Film Formation)

After the SiN film having a predetermined thickness is formed, an $O_2$ gas and a $H_2$ gas are supplied to the wafer 200 in the process chamber 201, namely the SiN film formed on the wafer 200.

Specifically, the valves 243c and 243e are opened to allow the $O_2$ gas and the $H_2$ gas to flow through the gas supply pipes 232c and 232e, respectively. Flow rates of the $O_2$ gas and the $H_2$ gas flowing through the gas supply pipes 232c and 232e are adjusted by the MFC 241c and 241e, respectively. The $O_2$ gas and the $H_2$ gas are supplied into the process chamber 201 via the nozzles 249c and 249b respectively. The $O_2$ gas and the $H_2$ gas are mixed and reacted with each other in the process chamber 201 and are then exhausted from the exhaust port 231a. At this time, moisture ($H_2O$)-free oxidation species containing oxygen such as atomic oxygen or the like generated by the reaction of the $O_2$ gas with the $H_2$ gas are supplied to the wafer 200 ($O_2$ gas+$H_2$ gas supply). At this time, the valves 243f to 243h may be opened to supply the $N_2$ gas into the process chamber 201 via the nozzles 249a to 249c.

Processing conditions at this step may be exemplified as follows:

$O_2$ gas supply flow rate: 0.1 to 10 slm $H_2$ gas supply flow rate: 0.1 to 10 slm Supply time of each gas: 1 to 120 seconds, specifically 1 to 60 seconds in some embodiment Processing pressure: 1 to 2,000 Pa, specifically 1 to 1,000 Pa in some embodiments.

Other processing conditions may be similar to the processing conditions of step 1.

Figure 4B:
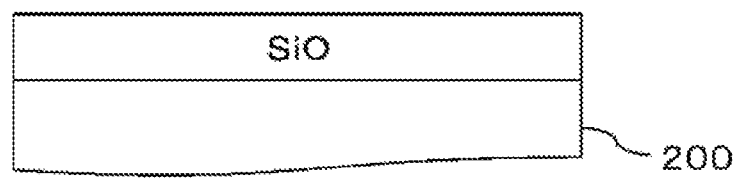
FIG. 4B is a partial enlarged cross-sectional of the surface of the wafer 200 after the silicon nitride film formed on the surface of the wafer 200 as a base is changed into a silicon oxide film.

By supplying the $O_2$ gas and the $H_2$ gas to the wafer 200 under the aforementioned conditions, the SiN film formed on the wafer 200 can be oxidized by using a strong oxidizing power of the oxidation species such as atomic oxygen to introduce O into the film. In addition, N contained in the SiN film can be desorbed from the film. Thus, as illustrated in FIG. 4B, the SiN film formed on the wafer 200 by the nitride film formation can be changed into a SiO film. As described above, in the nitride film formation, the aforementioned maximum distance X is set to a size which falls within a range of 2 to 4 nm. This makes it possible to allow the reactions such as the oxidation of the SiN film and the desorption of N from the SiN film described above to progress over the entire SiN film in the thickness direction. For example, the interface between the SiO film formed on the wafer 200 and the base of the SiO film can be reliably oxidized, thereby suppressing N from remaining near the interface. As a result, the SiO film obtained by oxidizing the SiN film may become a high-purity and dense SiO film containing little or no N.

After the change of the SiN film into the SiO film is completed, the valves 243c and 243e are closed to stop the supply of the $O_2$ gas and the $H_2$ gas into the process chamber 201. Then, the gas and the like remaining within the process chamber 201 are removed from the interior of the process chamber 201 according to the same processing procedures as those of the purge at step 1 (purge).

As the oxidizing gas, it may be possible to use, in addition to the $O_2$ gas+$H_2$ gas, an oxygen ($O_2$) gas, oxygen plasma ($O_2$*), an ozone ($O_3$) gas, an $O_3$ gas+$H_2$ gas, water vapor ($H_2O$), a hydrogen peroxide ($H_2O_2$) gas, or the like.

[Repetition of Cycle]

Figure 4C:
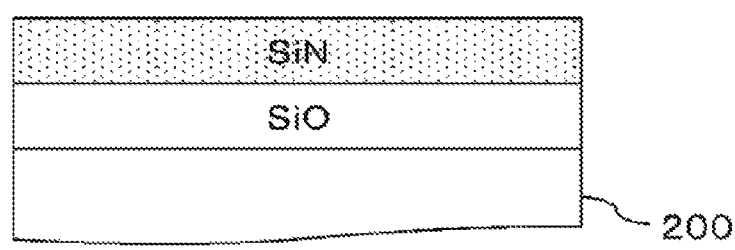
FIG. 4C is a partial enlarged cross-sectional of the surface of the wafer 200 after a silicon nitride film is formed on the silicon oxide film, which is formed on the wafer 200, as a base.
Figure 4D:
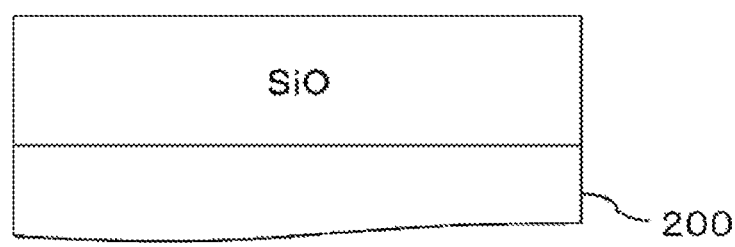
FIG. 4D is a partial enlarged cross-sectional of the surface of the wafer 200 after the silicon nitride film formed on the silicon oxide film as the base is changed into a silicon oxide film.

Subsequently, the nitride film formation and the oxide film formation described above are performed in this order again to form a SiN film on the SiO film formed on the wafer 200 as a base, as illustrated in FIG. 4C, and the SiN film formed on the SiO film as a base may be changed into a SiO film, as illustrated in FIG. 4D. By performing a cycle which non-simultaneously, that is, non-synchronously, and alternately performs the nitride film formation and the oxide film formation in this way a plurality of times ($n_2$ times, where $n_2$ is an integer of 2 or more), a SiO film having a desired thickness may be formed on the wafer 200. This film becomes a high-purity and dense SiO film containing little or no N, which is excellent in characteristics such as insulation characteristics. Further, this SiO film formed by performing the cycle which non-simultaneously performs the nitride film formation and the oxide film formation a plurality of times becomes a film having a smaller film stress than that of the SiO film of the same thickness formed by performing the nitride film formation and the oxide film formation once in this order.

(After-Purge and Atmospheric Pressure Return)

After the formation of the SiO film on the wafer 200 is completed, the $N_2$ gas as a purge gas is supplied from each of the nozzles 249a to 249c into the process chamber 201 and is exhausted from the exhaust port 231a. Thus, the interior of the process chamber 201 is purged and the gas or the reaction byproduct remaining within the process chamber 201 is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203, and then are subsequently discharged from the boat 217 (wafer discharging).

(3) Effects According to the Present Embodiment

According to the present embodiment, one or more effects as set forth below may be achieved.

(a) By performing a cycle which non-simultaneously performs the nitride film formation and the oxide film formation by setting the aforementioned maximum distance X to a size which falls within a range of 2 to 4 nm a plurality of times in the nitride film formation, it is possible to allow the SiO film formed on the wafer 200 to become a high-purity SiO film containing little or no N and having high insulation characteristics.

(b) By performing a cycle which non-simultaneously performs the nitride film formation and the oxide film formation by using the $O_2$ gas+$H_2$ gas having a large oxidizing power as the oxidizing gas a plurality of times in the nitride film formation, it is possible to allow the SiO film formed on the wafer 200 to become a high-purity SiO film containing little or no N and having high insulation characteristics. Further, since the change of the SiN film into the SiO film can be efficiently performed in the oxide film formation, it is possible to increase the productivity of substrate processing.

(c) By setting the aforementioned maximum distance X to a size which falls within a range of 2 to 4 nm in the nitride film formation, since the change of the SiN film into the SiO film can be efficiently performed in the oxide film formation, it is possible to increase the productivity of the substrate processing.

(d) By performing a cycle which non-simultaneously performs the nitride film formation and the oxide film formation a plurality of times, it is possible to allow the SiO film formed on the wafer 200 to become a film having less internal stress. This makes it possible to avoid deformation of uneven structures such as pillars formed on the surface of the wafer 200.

(e) The effects mentioned above can be similarly achieved in the case where a precursor gas other than the HCDS gas is used, in the case where a nitriding gas other than the $NH_3$ gas is used, in the case where an oxidizing gas other than the $O_2$ gas+$H_2$ gas is used, or in the case where an inert gas other than the $N_2$ gas is used.

(4) Modifications

The substrate processing sequence according to the present embodiment may be modified as in the modifications described below. These modifications may be arbitrarily combined. Unless otherwise specified, processing procedures and processing conditions at each step of each modification may be similar to the processing procedures and processing conditions at each step of the aforementioned substrate processing sequence.

(Modification 1)

The thickness of the SiN film formed in the nitride film formation may be set different between when a first cycle is performed and when at least one subsequent cycle is performed by setting the number of times $n_1$ the set is performed in the nitride film formation in the first cycle different from the number of times $n_1$ the set is performed in the nitride film formation in the at least one subsequent cycle.

For example, the thickness of the SiN film formed in the nitride film formation in the first cycle may be set smaller than the thickness of the SiN film formed in the nitride film formation in the at least one subsequent cycle by setting the number of times $n_1$ the set is performed in the nitride film formation in the first cycle smaller than the number of times $n_1$ the set is performed in the nitride film formation in the at least one subsequent cycle.

For example, the thickness of the SiN film formed in the nitride film formation in the first cycle may be set at a thickness which falls within a range of 1 to 2 nm, and the thickness of the SiN film formed in the nitride film formation in the at least one subsequent cycle may be set at a thickness which falls within a range of 3 to 4 nm.

According to this modification, effects similar to the effects achieved by the aforementioned embodiments may be achieved.

Further, according to this modification, by setting the thickness of the SiN film formed in the nitride film formation in the first cycle smaller than the thickness of the SiN film formed in the nitride film formation in the at least one subsequent cycle, it becomes possible to promote the oxidation of the SiN film when the oxide film is formed in the first cycle. This makes it possible to further suppress N from remaining near the interface between the SiO film obtained by performing the oxide film formation and the base of the SiO film, and to promote cleaning of this interface. For example, it is possible to allow optimization of the interface, such as reduction of defects at the interface and reduction of leak paths. As a result, it becomes possible to reduce a leakage current. Further, since the SiN film to be oxidized formed in the nitride film formation in the first cycle is thin, it is possible to appropriately reduce the oxidizing power in the oxide film formation in the first cycle, and to suppress the oxidation of the surface of the wafer 200 as the base.

Further, according to this modification, by setting the SiN film formed in the nitride film formation in the at least one subsequent cycle (for example, a second cycle) larger than the thickness of the SiN film formed in the nitride film formation in the first cycle, it is possible to reduce the number of cycles $n_2$ in the at least one subsequent cycle. Further, it is possible to increase the oxidizing power when oxidizing the SiN film in the at least one subsequent cycle. This makes it possible to shorten an oxidation time and to improve the productivity.

(Modification 2)

The conditions under which the SiN film is oxidized in the oxide film formation may be set different between when the first cycle is performed and when the at least one subsequent cycle is performed. Specifically, at least one selected from the group of the temperature of the wafer 200 (processing temperature), the pressure at a space where the wafer 200 is located (processing pressure), the supply time of the oxidizing gas, and the supply flow rate of the oxidizing gas when the SiN film is oxidized in the oxide film formation may be set different between when the first cycle is performed and when the at least one subsequent cycle is performed.

For example, the conditions under which the SiN film is oxidized in the oxide film formation in the first cycle may be set to conditions where the oxidizing power is smaller than the conditions under which the SiN film is oxidized in the oxide film formation in the at least one subsequent cycle.

Specifically, the temperature of the wafer 200 when the SiN film is oxidized in the oxide film formation in the first cycle may be set lower than the temperature of the wafer 200 when the SiN film is oxidized in the oxide film formation in the at least one subsequent cycle. For example, the temperature of the wafer 200 when the SiN film is oxidized in the oxide film formation in the first cycle may be set at a temperature which falls within a range of 500 to 600 degrees C., and the temperature of the wafer 200 when the SiN film is oxidized in the oxide film formation in the at least one subsequent cycle may be set at a temperature which falls within a range of 650 to 750 degrees C.

Further, the pressure at the space where the wafer 200 is located when the SiN film is oxidized in the oxide film formation in the first cycle may be set higher than the pressure at the space where the wafer 200 is located when the SiN film is oxidized in the oxide film formation in the at least one subsequent cycle. For example, the pressure at the space where the wafer 200 is located when the SiN film is oxidized in the oxide film formation in the first cycle may be set at a pressure which falls within a range of 665 to 1,333 Pa, and the pressure at the space where the wafer 200 is located when the SiN film is oxidized in the oxide film formation in the at least one subsequent cycle may be set at a pressure which falls within a range of 1 to 133 Pa.

In addition, the supply time of the oxidizing gas when the SiN film is oxidized in the oxide film formation in the first cycle may be set shorter than the supply time of the oxidizing gas when the SiN film is oxidized in the oxide film formation in the at least one subsequent cycle. For example, the supply time of the oxidizing gas when the SiN film is oxidized in the oxide film formation in the first cycle may be set at a time which falls within a range of 1 to 30 seconds, and the supply time of the oxidizing gas when the SiN film is oxidized in the oxide film formation in the at least one subsequent cycle may be set at a time which falls within a range of 30 to 60 seconds.

Further, the supply flow rate of the oxidizing gas when the SiN film is oxidized in the oxide film formation in the first cycle may be set smaller than the supply flow rate of the oxidizing gas when the SiN film is oxidized in the oxide film formation in the at least one subsequent cycle. For example, the supply flow rates of the $O_2$ gas and the $H_2$ gas when the SiN film is oxidized in the oxide film formation in the first cycle may be each set to 500 sccm, and the supply flow rates of the $O_2$ gas and the $H_2$ gas when the SiN film is oxidized in the oxide film formation in the at least one subsequent cycle may be each set to 2,000 sccm.

According to this modification, the same effects similar to those achieved by the aforementioned embodiments may be achieved.

Moreover, according to this modification, by appropriately reducing the oxidizing power in the first cycle, it is possible to suppress the oxidation of the surface of the wafer 200 as the base. Further, by appropriately increasing the oxidizing power in the at least one subsequent cycle to shorten an oxidation time, it is possible to improve the productivity of substrate processing. The SiO film formed in the first cycle acts as an oxidation block layer that suppresses oxygen from diffusing into the wafer 200 in the at least one subsequent cycle. Therefore, even when the oxidizing power is increased in the at least one subsequent cycle, it is possible to suppress the oxidation of the surface of the wafer 200 as the base.

(Modification 3)

A cycle which non-simultaneously perform the nitride film formation and the oxide film formation may be performed three or more times.

For example, when the cycle is performed three times, the thickness of the SiN film formed in the nitride film formation may be set different between when the first cycle is performed and when the at least one subsequent cycle (for example, the second cycle and/or a third cycle) is performed as in modification 1.

For example, the thickness of the SiN film formed in the nitride film formation in the first cycle may be set smaller than the thickness of the SiN film formed in the nitride film formation in the at least one subsequent cycle (for example, the second cycle and/or the third cycle). For example, the thickness of the SiN film formed in the nitride film formation in the first cycle may be set to 1 to 2 nm, the thickness of the SiN film formed in the nitride film formation in the second cycle may be set to 3 to 4 nm, and the thickness of the SiN film formed in the nitride film formation in the third cycle may be set to 3 to 4 nm.

Further, when the cycle is performed three times, the conditions under which the SiN film is oxidized in the oxide film formation may be set different between when the first cycle is performed and when the at least one subsequent cycle (for example, the second cycle and/or the third cycle) is performed as in modification 2.

For example, the conditions under which the SiN film is oxidized in the oxide film formation in the first cycle may be set to conditions where the oxidizing power is smaller than the conditions under which the SiN film is oxidized in the oxide film formation in the at least one subsequent cycle (for example, the second cycle and/or the third cycle).

Specifically, for example, the temperature of the wafer 200 when the SiN film is oxidized in the oxide film formation in the first cycle may be set lower than the temperature of the wafer 200 when the SiN film is oxidized in the oxide film formation in the at least one subsequent cycle (for example, the second cycle and/or the third cycle). For example, the temperature of the wafer 200 when the SiN film is oxidized in the oxide film formation in the first cycle may be set at a temperature which falls within a range of 500 to 600 degrees C., and the temperature of the wafer 200 when the SiN film is oxidized in the oxide film formation in the at least one subsequent cycle (for example, the second cycle and/or the third cycle) may be set at a temperature which falls within a range of 650 to 750 degrees C.

Further, the pressure at the space where the wafer 200 is located when the SiN film is oxidized in the oxide film formation in the first cycle may be set higher than the pressure at the space where the wafer 200 is located when the SiN film is oxidized in the oxide film formation in the at least one subsequent cycle (for example, the second cycle and/or the third cycle). For example, the pressure at the space where the wafer 200 is located when the SiN film is oxidized in the oxide film formation in the first cycle may be set at a pressure which falls within a range of 665 to 1,333 Pa, and the pressure at the space where the wafer 200 is located when the SiN film is oxidized in the oxide film formation in the at least one subsequent cycle (for example, the second cycle and/or the third cycle) may be set at a pressure which falls within a range of 1 to 133 Pa.

Further, the supply time of the oxidizing gas when the SiN film is oxidized in the oxide film formation in the first cycle may be set shorter than the supply time of the oxidizing gas when the SiN film is oxidized in the oxide film formation in the at least one subsequent cycle (for example, the second cycle and/or the third cycle). For example, the supply time of the oxidizing gas when the SiN film is oxidized in the oxide film formation in the first cycle may be set at a time which falls within a range of 1 to 30 seconds, and the supply time of the oxidizing gas when the SiN film is oxidized in the oxide film formation in the at least one subsequent cycle (for example, the second cycle and/or the third cycle) may be set at a time which falls within a range of 30 to 60 seconds.

Further, the supply flow rate of the oxidizing gas when the SiN film is oxidized in the oxide film formation in the first cycle may be set smaller than the supply flow rate of the oxidizing gas when the SiN film is oxidized in the oxide film formation in the at least one subsequent cycle (for example, the second cycle and/or the third cycle). For example, the supply flow rates of the $O_2$ gas and the $H_2$ gas when the SiN film is oxidized in the oxide film formation in the first cycle may be each set to 500 sccm, and the supply flow rates of the $O_2$ gas and the $H_2$ gas when the SiN film is oxidized in the oxide film formation in the at least one subsequent cycle (for example, the second cycle and/or the third cycle) may be each set to 2,000 sccm.

According to this modification, the same effects as those achieved by the aforementioned embodiments and modifications 1 and 2 may be achieved.

(Modification 4)

As in the processing sequence described below, a set may be performed a predetermined number of times ($n_1$ times, where $n_1$ is an integer of 1 or more) in the nitride film formation, the set including a step of supplying a STC gas as the first precursor gas to the wafer 200, a step of supplying a HCDS gas as the second precursor gas to the wafer 200, and a step of supplying a $NH_3$ gas as the nitriding gas to the wafer 200. The processing conditions of the step of supplying the STC gas and the step of supplying the HCDS gas may be respectively similar to the processing conditions of step 1 of the aforementioned embodiments. Further, by setting the supply time of the STC gas equal to or longer than the supply time of the HCDS gas, specifically by setting the supply time of the STC gas longer than the supply time of the HCDS gas in some embodiments, it is possible to more sufficiently achieve effects described below. The processing conditions of the step of supplying the $NH_3$ gas may be similar to the processing conditions of step 2 of the aforementioned embodiments.

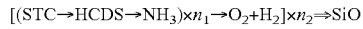

$[(STC \rightarrow HCDS \rightarrow NH_3) \times n_1 \rightarrow O_2 + H_2] \times n_2 \Rightarrow SiO$ According to this modification, the same effects as those of the aforementioned embodiments may be achieved.

Further, according to this modification, it is possible to improve step coverage characteristics of the SiN film formed on the wafer 200, that is, the SiO film obtained by oxidizing this film. This may be because the STC gas containing one Si in one molecule is more difficult to decompose (more difficult to adsorb or less reactive) than the HCDS gas containing two Si in one molecule under the same conditions. Further, by using two kinds of precursor gases, it is possible to increase a cycle rate (the thickness of the SiN layer formed per one cycle) in the nitride film formation, compared with the case of using one kind of precursor gas, and to increase the productivity of substrate processing.

Other Embodiments of the Present Disclosure

While the embodiments of the present disclosure have been specifically described above, the present disclosure is not limited to the aforementioned embodiments but may be variously modified without departing from the spirit of the present disclosure.

For example, in the aforementioned embodiments, there have been described examples in which the nitride film formation and the oxide film formation are performed in the same process chamber 201 (in-situ). However, the nitride film formation and the oxide film formation may be performed in different process chambers (in ex-situ). In the case where a series of processing is performed in-situ, the wafer 200 is not exposed to the air during the processing and the processing may be performed consistently while the wafer 200 is kept under vacuum, enabling stable substrate processing. Further, in the case where a portion of the processing is performed in ex-situ, the internal temperature of each process chamber may be set in advance at, for example, a processing temperature in each processing or a temperature close to the processing temperature. Thus, it is possible to shorten a time taken to adjust a temperature and to improve the production efficiency.

Recipes used in each processing may be provided individually according to the processing contents and may be stored in the memory device 121c via a telecommunication line or the external memory device 123. Moreover, at the start of each processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start each processing while avoiding an operation error.

The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which the film is formed by using a batch-type substrate processing apparatus capable of processing a plurality of substrates at a time. The present disclosure is not limited to the aforementioned embodiments but may be appropriately applied to, for example, a case where the film is formed by using a single-wafer-type substrate processing apparatus capable of processing a single substrate or several substrates at a time. Further, in the aforementioned embodiments, there has been described an example in which the film is formed by using the substrate processing apparatus including a hot-wall-type process furnace. The present disclosure is not limited to the aforementioned embodiments but may be appropriately applied to a case where the film is formed by using a substrate processing apparatus including a cold-wall-type process furnace.

Even in the case of using these substrate processing apparatuses, each processing may be performed with processing sequences and processing conditions similar to those of the embodiments described above to achieve effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

EXAMPLE

As samples 1 to 4, SiO films each having predetermined thicknesses are formed on bases having corners by the processing sequence of the aforementioned embodiments. In any sample, processing conditions in each step are set to common conditions which fall within the processing condition ranges described in the aforementioned embodiments. A maximum distance X from an interface between a SiN film formed in the nitride film formation and the base of the SiN film to a surface of a nitride film is set to less than 2 nm, 2 nm, 4 nm, and more than 4 nm in the order of samples 1 to 4.

After a film-forming process is completed, a composition of the film formed on the wafer is examined. As a result, it is confirmed that residue of N is found near the interface of the corner in the film of sample 4, while no residue of N is found in the films of samples 1 to 3. Further, it is confirmed that film formation rates of the films in samples 2 to 4 are of a practical size, while the film formation rate of the film in sample 1 is too low to be practical. That is, it is confirmed that, by setting the maximum distance X to a size which falls within a range of 2 to 4 nm, it is possible to suppress the residue of N in the SiO film while allowing the formation rate of the SiO film to have a practical size.

According to the present disclosure in some embodiments, it is possible to improve a quality of an oxide film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming an oxide film having a predetermined thickness on a surface of the substrate by performing a cycle a plurality of times, the cycle including non-simultaneously performing:
        (a) forming a nitride film by supplying a film-forming gas to the substrate; and
        (b) oxidizing and changing the nitride film into a first oxide film by supplying an oxidizing gas to the substrate,
    wherein the cycle includes a first cycle and at least one subsequent cycle, and
    wherein a thickness of the nitride film formed in (a) is set different between when the first cycle is performed and when the at least one subsequent cycle is performed.

2. The method according to claim 1, wherein the cycle includes a first cycle and at least one subsequent cycle,
    wherein (a) includes performing a set a predetermined number of times, the set including:
        supplying a precursor gas as the film-forming gas to the substrate; and
        supplying a nitriding gas as the film-forming gas to the substrate,
    wherein the number of times the set is performed in the first cycle is set different from the number of times the set is performed in the at least one subsequent cycle.

3. The method according to claim 1, wherein the cycle includes a first cycle and at least one subsequent cycle, and
    wherein a thickness of the nitride film formed in (a) in the first cycle is set smaller than a thickness of the nitride film formed in (a) in the at least one subsequent cycle.

4. The method according to claim 1, wherein the cycle includes a first cycle and at least one subsequent cycle,
    wherein (a) includes performing a set a predetermined number of times, the set including:
        supplying a precursor gas as the film-forming gas to the substrate; and
        supplying a nitriding gas as the film-forming gas to the substrate,
    wherein the number of times the set is performed in the first cycle is set smaller than the number of times the set is performed in the at least one subsequent cycle.

5. The method according to claim 1, wherein the cycle includes a first cycle and at least one subsequent cycle, and
    wherein at least one selected from the group of a temperature of the substrate, a pressure at a space where the substrate is located, a supply time of the oxidizing gas, and a supply flow rate of the oxidizing gas when the nitride film is oxidized in (b) is set different between when the first cycle is performed and when the at least one subsequent cycle is performed.

6. The method according to claim 1, wherein the cycle includes a first cycle and at least one subsequent cycle, and
    wherein a condition under which the nitride film is oxidized in (b) in the first cycle is set to a condition where an oxidizing power is smaller than a condition under which the nitride film is oxidized in (b) in the at least one subsequent cycle.

7. The method according to claim 1, wherein the cycle includes a first cycle and at least one subsequent cycle, and
    wherein a temperature of the substrate when the nitride film is oxidized in (b) in the first cycle is set lower than a temperature of the substrate when the nitride film is oxidized in (b) in the at least one subsequent cycle.

8. The method according to claim 1, wherein the cycle includes a first cycle and at least one subsequent cycle, and
    wherein a pressure at a space where the substrate is located when the nitride film is oxidized in (b) in the first cycle is set higher than a pressure at the space where the substrate is located when the nitride film is oxidized in (b) in the at least one subsequent cycle.

9. The method according to claim 1, wherein the cycle includes a first cycle and at least one subsequent cycle, and
    wherein a supply time of the oxidizing gas when the nitride film is oxidized in (b) in the first cycle is set shorter than a supply time of the oxidizing gas when the nitride film is oxidized in (b) in the at least one subsequent cycle.

10. The method according to claim 1, wherein the cycle includes a first cycle and at least one subsequent cycle, and
    wherein a supply flow rate of the oxidizing gas when the nitride film is oxidized in (b) in the first cycle is set smaller than a supply flow rate of the oxidizing gas when the nitride film is oxidized in (b) in the at least one subsequent cycle.

11. The method according to claim 1, wherein (a) and (b) are performed in the same process chamber.

12. The method according to claim 1, wherein (a) and (b) are performed in different process chambers.

13. A non-transitory computer-readable recording medium storing a program that causes, by a computer, a substrate processing apparatus to perform the method of claim 1.

14. A method of manufacturing a semiconductor device, comprising the method of claim 1.

15. A method of processing a substrate, comprising:
forming an oxide film having a predetermined thickness on a surface of the substrate by performing a cycle a plurality of times, the cycle including non-simultaneously performing:
 (a) forming a nitride film by supplying a film-forming gas to the substrate; and
 (b) oxidizing and changing the nitride film into a first oxide film by supplying an oxidizing gas to the substrate,
wherein the cycle includes a first cycle and at least one subsequent cycle, and
wherein a condition under which the nitride film is oxidized in (b) is set different between when the first cycle is performed and when the at least one subsequent cycle is performed.

16. A non-transitory computer-readable recording medium storing a program that causes, by a computer, a substrate processing apparatus to perform the method of claim 15.

17. A method of manufacturing a semiconductor device, comprising the method of claim 15.

18. A method of processing a substrate, comprising:
forming an oxide film having a predetermined thickness on a surface of the substrate by performing a cycle a plurality of times, the cycle including non-simultaneously performing:
 (a) forming a nitride film by supplying a film-forming gas to the substrate; and
 (b) oxidizing and changing the nitride film into a first oxide film by supplying an oxidizing gas to the substrate,
wherein (a) includes performing a set a predetermined number of times, the set including:
 supplying a first precursor gas as the film-forming gas to the substrate;
 supplying a second precursor gas as the film-forming gas to the substrate; and
 supplying a nitriding gas as the film-forming gas to the substrate.

19. The method according to claim 18, wherein the first precursor gas is more difficult to decompose than the second precursor gas under a same condition.

20. The method according to claim 18, wherein the first precursor gas contains one Si in one molecule, and the second precursor gas contains two or more Si in one molecule.

21. A non-transitory computer-readable recording medium storing a program that causes, by a computer, a substrate processing apparatus to perform the method of claim 18.

22. A method of manufacturing a semiconductor device, comprising the method of claim 18.

23. A substrate processing apparatus, comprising:
a process chamber in which a substrate is processed;
a film-forming gas supply system configured to supply a film-forming gas to the substrate in the process chamber;
an oxidizing gas supply system configured to supply an oxidizing gas to the substrate in the process chamber; and
a controller configured to be capable of controlling the film-forming gas supply system and the oxidizing gas supply system to perform a process of forming an oxide film having a predetermined thickness on a surface of the substrate in the process chamber by performing a cycle a plurality of times, the cycle including non-simultaneously performing:
 (a) forming a nitride film by supplying the film-forming gas to the substrate; and
 (b) oxidizing and changing the nitride film into a first oxide film by supplying the oxidizing gas to the substrate,
wherein the cycle includes a first cycle and at least one subsequent cycle, and
wherein a thickness of the nitride film formed in (a) is set different between when the first cycle is performed and when the at least one subsequent cycle is performed.

24. A substrate processing apparatus, comprising:
a process chamber in which a substrate is processed;
a film-forming gas supply system configured to supply a film-forming gas to the substrate in the process chamber;
an oxidizing gas supply system configured to supply an oxidizing gas to the substrate in the process chamber; and
a controller configured to be capable of controlling the film-forming gas supply system and the oxidizing gas supply system to perform a process of forming an oxide film having a predetermined thickness on a surface of the substrate in the process chamber by performing a cycle a plurality of times, the cycle including non-simultaneously performing:
 (a) forming a nitride film by supplying the film-forming gas to the substrate; and
 (b) oxidizing and changing the nitride film into a first oxide film by supplying the oxidizing gas to the substrate,
wherein the cycle includes a first cycle and at least one subsequent cycle, and
wherein a condition under which the nitride film is oxidized in (b) is set different between when the first cycle is performed and when the at least one subsequent cycle is performed.

25. A substrate processing apparatus, comprising:
a process chamber in which a substrate is processed;
a film-forming gas supply system configured to supply a film-forming gas to the substrate in the process chamber;
an oxidizing gas supply system configured to supply an oxidizing gas to the substrate in the process chamber; and
a controller configured to be capable of controlling the film-forming gas supply system and the oxidizing gas supply system to perform a process of forming an oxide film having a predetermined thickness on a surface of the substrate in the process chamber by performing a cycle a plurality of times, the cycle including non-simultaneously performing:

(a) forming a nitride film by supplying the film-forming gas to the substrate; and
(b) oxidizing and changing the nitride film into a first oxide film by supplying the oxidizing gas to the substrate,
wherein (a) includes performing a set a predetermined number of times, the set including:
  supplying a first precursor gas as the film-forming gas to the substrate;
  supplying a second precursor gas as the film-forming gas to the substrate; and
  supplying a nitriding gas as the film-forming gas to the substrate.

* * * * *